United States Patent [19]

Utner et al.

[11] Patent Number: 4,617,609
[45] Date of Patent: Oct. 14, 1986

[54] ELECTRIC CAPACITOR IN THE FORM OF A CHIP COMPONENT AND METHOD FOR MANUFACTURING SAME

[75] Inventors: Ferdinand Utner, Regensburg; Herbert Bolz, Wiernsheim-Serres, both of Fed. Rep. of Germany

[73] Assignee: Siemens Aktiengesellschaft, Berlin & Munich, Fed. Rep. of Germany

[21] Appl. No.: 707,591

[22] Filed: Mar. 4, 1985

[30] Foreign Application Priority Data

Apr. 3, 1984 [DE] Fed. Rep. of Germany ....... 3412492

[51] Int. Cl.$^4$ .......................... H01G 1/14; H01G 4/10; H01G 7/00
[52] U.S. Cl. .................................. 361/310; 29/25.42; 361/321
[58] Field of Search .................. 29/25.42; 361/321 C, 361/433 C, 306–310, 400, 402, 404, 405

[56] References Cited

U.S. PATENT DOCUMENTS

| | | | |
|---|---|---|---|
| 2,673,972 | 3/1954 | Minnium | 361/308 |
| 3,236,936 | 2/1966 | Robinson | 361/308 X |
| 3,439,395 | 4/1969 | Claypoole et al. | 29/25.42 |
| 3,612,963 | 10/1971 | Piper et al. | 29/25.42 X |
| 3,670,378 | 6/1972 | Behn et al. | |
| 3,728,765 | 4/1973 | Behn et al. | |
| 3,739,438 | 6/1973 | Lambrecht | 29/25.42 |
| 3,740,624 | 6/1973 | McAdams, Jr. et al. | |
| 3,766,451 | 10/1973 | Voda et al. | |
| 3,778,532 | 12/1973 | Braden | |
| 4,004,200 | 1/1977 | Johanson | 361/321 C X |
| 4,158,218 | 6/1979 | McLaurin et al. | 361/310 X |
| 4,168,520 | 9/1979 | Coleman et al. | 29/25.42 X |
| 4,205,365 | 5/1980 | Kalina | |
| 4,288,842 | 9/1981 | Voyles | 361/433 C |

FOREIGN PATENT DOCUMENTS

| | | |
|---|---|---|
| 1764541 | 3/1973 | Fed. Rep. of Germany . |
| 3134617 | 3/1983 | Fed. Rep. of Germany . |
| 3120298 | 7/1983 | Fed. Rep. of Germany . |
| 1335159 | 10/1973 | United Kingdom . |
| 2027274 | 2/1980 | United Kingdom . |

Primary Examiner—Donald A. Griffin
Attorney, Agent, or Firm—Hill, Van Santen, Steadman & Simpson

[57] ABSTRACT

An electric capacitor which can be soldered to a printed circuit board in the manner of a chip component, without damaging the capacitor, has capacitor plates with electrodes therebetween arranged in a stack, the electrodes alternatingly terminating at opposite end faces of the capacitor, at which a metal plating is applied, with a portion of respective bands of flexible metal being disposed adjacent each metal plating forming current leads, with the portion of the band adjacent the metal plating being encapsulated with the capacitor, and a remaining portion of each band projecting outside of the encapsulation and being bent at least partially around exterior sides of the encapsulation and forming soldering surfaces. A method for manufacturing such a capacitor includes the steps of cutting spaced recesses in a metal plate for producing a number of continuous parallel bands extending between two margins of the plate, cutting and bending those bands and inserting a stacked capacitor with the metal platings between the cut ends of the band, encapsulating the capacitor and the portions of the bands adjacent thereto, and severing the opposite ends of the bands from the plate margins and bending the severed portions around a part of the exterior of the encapsulation.

15 Claims, 16 Drawing Figures

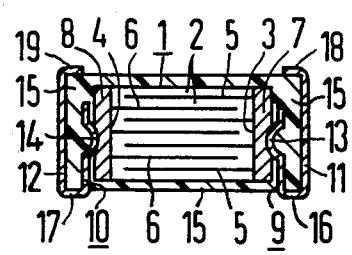
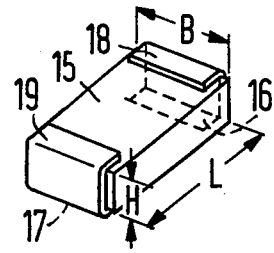
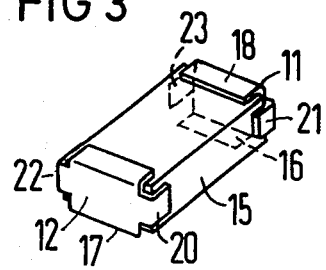
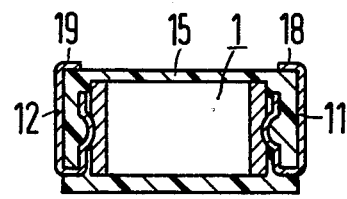
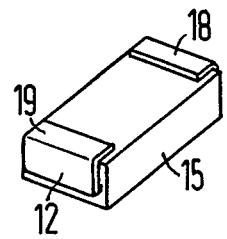
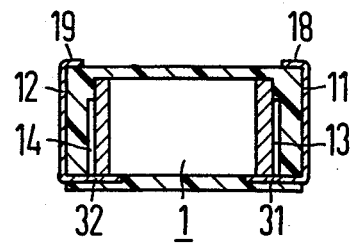
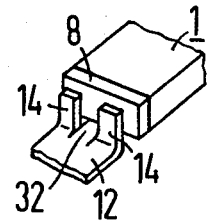

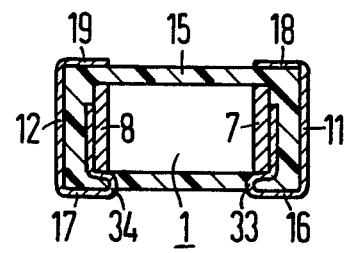
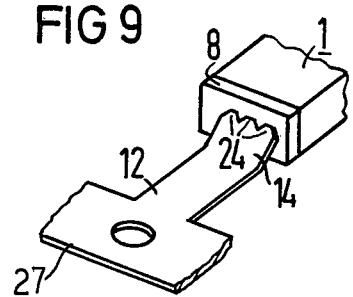
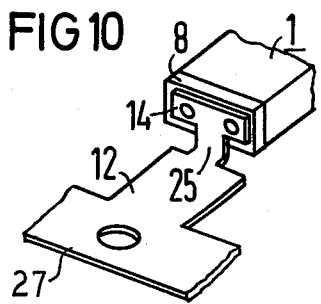
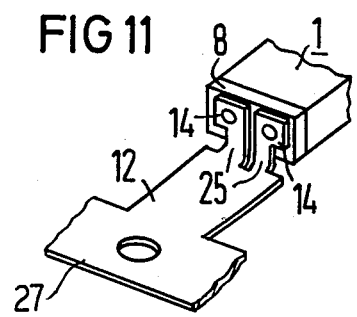
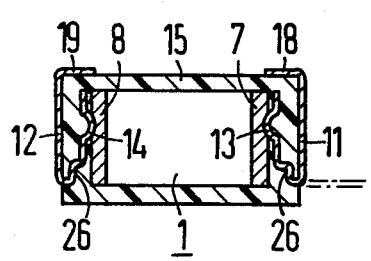
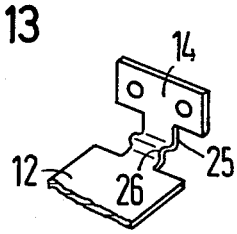
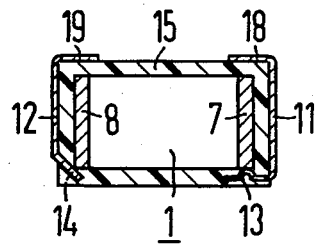

ELECTRIC CAPACITOR IN THE FORM OF A CHIP COMPONENT AND METHOD FOR MANUFACTURING SAME

BACKGROUND OF THE INVENTION

1. Field of the Invention

The present invention relates to capacitors capable of being mounted on printed circuit boards by means of soldering, and a method for manufacturing such capacitors.

2. Description of the Prior Art

Capacitors which are in the form of individual components for mounting by soldering on a printed circuit board must resist the influences of the solder fluxing agent, the hot liquid solder, as well as chemical liquid cleaning agents without damage to the capacitor itself.

Capacitors are known in the art having a stacked or layered construction or a flat-pressed winding, with the layers having coatings on the large faces thereof which respectively terminate at opposite end faces of the capacitor stack or winding with a metal plated layer being electrically conductively connected to the coatings at each of the end faces. Current leads are electrically and mechanically connected to the metal platings. Such a stacked or layered capacitor is described, for example, in German Pat. No. 1,764,541, corresponding to U.S. Pat. Nos. 3,670,378 and 3,728,765.

Other types of capacitors are also known consisting of a sintered member, such as a tantalum sinter capacitor, those capacitors also having metal elements disposed at opposite end faces for connecting to current leads. Generally the tantalum sinter element is porous and has coatings on opposite sides thereof consisting of conductive metal oxides, these coatings being generated during the individual manufacturing steps for the capacitor.

Ceramic multi-layer capacitors are also known such as described, for example, in the U.S. Pat. No. 3,740,624, consisting of alternating ceramic and metal layers, with the metal layers being guided to opposite end faces of the capacitors and being electrically connected at the end faces by means of metal plating.

A problem in the use of such capacitors, particular capacitors of the type described above having dielectric material consisting of plastic, is the sensitivity of such capacitors to the influence of fluxing agents, hot liquid solder, and liquid chemical cleaning agents. Plastics commonly utilized as dielectric material in capacitors are, for example, polyethylene terephthalate, polycarbonate, polypropylene, cellulose acetate, and the like. Capacitors having a ceramic dielectric element or a tantalum sinter member are also subject to being damaged during the mounting of such capacitors as chip components on a printed circuit board. For example, by the influence of the heat accompanying the application of solder, the dielectric properties can change in an unfavorable manner, and the chemical influence of the fluxing agent and/or of cleaning agents may also adversely affect such capacitors.

In order to minimize the influence of such disturbances, many electronic components, including capacitors, are contained in housings or envelopes which provide a certain immunization from such influences, making those components suitable for utilization as chip components. Generally when attaching such components to a printed circuit board, solder is employed which, in the liquid state, exhibits temperatures up to 260° C., and the soldering operation lasts approximately 10 seconds.

A capacitor is described in German Pat. No. 3,120,298 in chip component construction which includes a capacitor member comprised of foils with opposite end faces provided with solderable contact layers and having a metallic component in the form of a cap associated therewith. Each metal component is a separately manufactured element consisting of solder-resistant material and having at least one opening in a base region thereof, so that a solder connection extending at least into the opening between a connection layer and the metal component is formed. This embodiment assumes that, when installation on a printed circuit board is undertaken, the liquid solder reaches only the metal component, but not the actual capacitor. In the normal mounting and attachment of such chip components to printed circuit boards, however, the so-called flow solder method is employed wherein the components come virtually entirely into contact with liquid solder at a temperature of 260° C. for approximately 10 seconds. This is particularly true if the components are arranged on the wiring side of the circuit board.

SUMMARY OF THE INVENTION

It is an object of the present invention to provide an electric capacitor of the type described above which is substantially impervious to potentially damaging influences occuring during mounting and attachment of the capacitor to a printed circuit board.

It is a further object to the present invention to provide such a capacitor which maintains substantially exact geometric dimensions.

It is a further object to the present invention to provide a method for manufacturing such capacitors.

The above objects are inventively achieved in a capacitor component wherein the capacitor itself is provided with metal platings at opposite end faces thereof, and a portion of a band consisting of flexible metal is disposed adjacent to each of the end faces in contact with the metal platings. The capacitor and the portions of the metal bands in contact with the end faces are encapsulated in a protective covering, and a remaining portion of each band extending outside of the encapsulation is bent to partially surround the exterior surface of the encapsulation, thereby providing soldering surfaces for attachment to a printed circuit board which are substantially mechanically and thermally insulated from the capacitor itself, thereby minimizing damage thereto during attachment to the printed circuit board.

The bands, in addition to being flexible, are comprised of solderable metal. The material utilized to encapsulate the capacitor and the portions of the bands adjacent thereto consists of high temperature-resistant plastic of the type well known to those skilled in the art for encapsulation purposes.

The ends of the bands in contact with the metal platings of the capacitor can be attached thereto by soldering, welding, or by means of a conductive adhesive. The ends of the bands may also simply be placed in pressure contact with the metal platings, with the necessary mechanical support and rigidity being obtained by encapsulation within the covering.

In a further embodiment of the invention, each band may have at least one narrowed neck which serves to minimize heat transfer from the exposed portion of the band to which the solder is applied and the capacitor.

In other embodiments, each band may exhibit specially configured bends between the portion thereof adjacent to the metal platings and the portion which is attached to the printed circuit board, in order to compensate for dimensional tolerances of the capacitor elements.

An adhesion promoter of the type well known to those skilled in the art may be applied to at least the portions of the metal bands which are contained within the interior of the encapsulation to insure rigidity between the metal platings, the portions of the bands adjacent thereto, and the plastic encapsulation envelope.

A method for manufacturing such a capacitor begins utilizing a tinned plate of the type utilized for providing leads for other types of chip components, the plate having a plurality of parallel recesses cut or stamped therein so as to provide two plate margins with a plurality of generally parallel spaced bands extending transversely therebetween. The transversely extending bands are each cut at an approximate center thereof, and the free ends are bent upwardly to form the portions of the bands which will be encapsulated. A capacitor of any suitable type having metalized end faces is inserted between the bent free ends of the bands, and the capacitor and band portions adjacent thereto are encapsulated. The opposite ends of the bands are then severed from the plate margins and bent around a portion of the exterior of the encapsulated component in accordance with one of several embodiments.

The bent portions of the bands, which are encapsulated with the capacitor and which are adjacent to the metalized end faces thereof, may be electrically and/or mechanically attached to the end faces by any suitable means, such as by spot welding.

The tolerances of the exterior dimensions of completed encapsulated component are particularly important when such components are utilized as a chip, and can be very precisely observed in this manufacturing method. The dimensions are independent of possible manufacture-conditioned tolerances of the capacitor members themselves. The encapsulation envelope can be comprised of a plastic which is flame-retardant, or self-extinguishing, and which is insensitive to most chemical influences. The plastic employed for the encapsulation also provides heat insulation. For this purpose, plastics such as epoxy resins, silicon resins, or polyphenylene sulfide (PPS) may be utilized which contain mineral and/or glass filler particles. Phenolic resins may also be employed. It will be understood that a prerequisite for any type of plastic which is utilized for the encapsulation material is that the plastic withstand any mechanical loads which occur in the manufacture of the envelope.

The capacitor which is contained in the capacitor chip disclosed herein is preferably a stacked or layered capacitor having polyethylene terephthalate as the dielectric and polyphenylene sulfide (PPS) as the encapsulation material. Such capacitors after manufacture may be subjected to an additional thermal treatment and thereby exhibit a crystalization degree of at least 50%, as described in German patent application No. OS/3,412,463 U.S. Ser. No. 717,729, filed Mar. 29, 1985.

DESCRIPTION OF THE DRAWINGS

FIG. 1 is a side view in section of a capacitor chip constructed in accordance with the principles of the present invention;

FIG. 2 is a perspective view of the capacitor chip shown in FIG. 1;

FIG. 3 is a perspective view of another embodiment of the capacitor chip shown in FIG. 1;

FIG. 4 is a side view in section of another embodiment of a capacitor chip constructed in accordance with the principles of the present invention;

FIG. 5 is a perspective view of the capacitor chip shown in FIG. 4;

FIG. 6 is a side view in section of a further embodiment of a capacitor chip constructed in accordance with the principles of the present invention;

FIG. 7 is a partial perspective view of the capacitor chip shown in FIG. 6;

FIG. 8 is a side view in section of another embodiment of a capacitor chip constructed in accordance with the principles of the present invention;

FIG. 9 is a perspective view of a furthere embodiment of attachment of the current leads to the metalized plate of the capacitor chip constructed in accordance with the principles of the present invention;

FIG. 10 is a perspective view of another method for attaching the current leads to the metalized plate of a capacitor chip constructed in accordance with the principles of the present invention having a narrowed neck portion;

FIG. 11 is a perspective view of a two-neck embodiment of the method of attachment shown in FIG. 10;

FIG. 12 is a side view in section of another embodiment of a chip capacitor constructed in accordance with the principles of the present invention;

FIG. 13 is a perspective view of a portion of a band forming the current lead for the capacitor chip shown in FIG. 12;

FIG. 14 is a side view in section of two further embodiments of attaching the current leads to the metalized plates in the capacitor chip constructed in accordance with the principles of the present invention;

DESCRIPTION OF THE PREFERRED EMBODIMENTS

Figure 15:
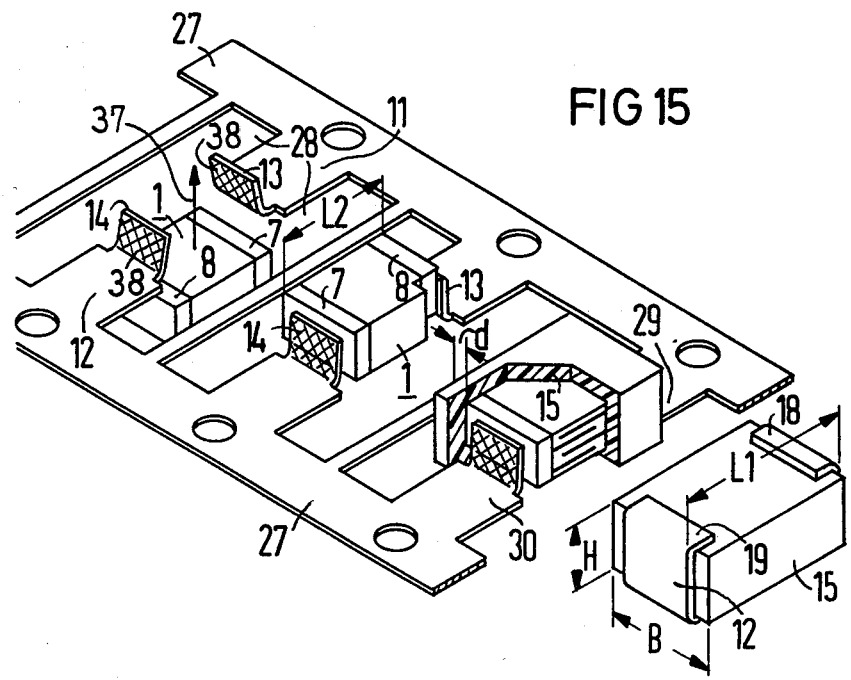
FIG. 15 is a perspective view of the several manufacturing steps for a method for manufacturing a capacitor in accordance with the principles of the present invention.

A capacitor chip constructed in accordance with the principles of the present invention is shown in sectional view in FIG. 1. The capacitor chip includes an arrangement of capacitor plates generally referenced at 1, which will be referred to herein as a capacitor member, which is to be distinguished from the overall capacitor chip, which includes the capacitor member. The capacitor member 1 consists of a plurality of alternating dielectric layers 2, with metal layers or coatings 5 and 6 therebetween the metal layers 5 all extend to one end face 3 of the capacitor member 1, which is provided with a metalized plating 7. The metal layers 6 all extend to an opposite end face 4 of the capacitor member 1, which is provided with a similar metal plating 8. The metal platings 7 and 8 may be applied by metal spraying, for example, and the platings 7 and 8 respectively electrically connect the metal layers 5 and 6.

The metal platings 7 and 8 have respective current leads 9 and 10 electrically and mechanically connected thereto. The leads 9 and 10 consists of respective flexible metal bands 11 and 12 comprised of solderable metal. Respective interior ends 13 and 14 of the bands 11 and 12 are adjacent to the platings 7 and 8, and are attached thereto by soldering, welding, or by means of a conductive adhesive. The capacitor member 1 and the interior ends 13 and 14 of the bands 11 and 12 are encapsulated and surrounded with an envelope 15 consisting of insulating material having a high resistance to heat. Exterior portions of the current leads 9 and 10 remain unencapsulated and extend to the interior of the envelope 15. These exterior portions of the bands 11 and 12 are bent to conform to a portion of the exterior surface of the encapsulation 15, and in the embodiment shown in FIG. 1 form lower soldering surfaces 16 and 17 and upper soldering surfaces 18 and 19. The capacitor chip is attached at these soldering surfaces to designated locations of a printed circuit word by soldering in the normal manner.

The exterior of the capacitor shown in FIG. 1 is shown in perspective view in FIG. 2. The exterior height H, length L, and width B of the encapsulation envelope 15 can be manufactured within very narrow tolerances.

A further embodiment of a capacitor chip is shown in FIG. 3, wherein each of the current leads is provided with further side flaps forming additional soldering surfaces 20, 22, 21 and 23. The flaps are formed on the pre-fabricated bands 11 and 12.

Another embodiment of the basic design shown in FIG. 1 is shown in side sectional view in FIG. 4, wherein the exterior portions of the bands 11 and 12 emerge from the sides of the capacitor chip, rather than the bottom of the chip, and only upper soldering surfaces 18 and 19 are provided. A perspective view of the exterior of such a capacitor is shown in FIG. 5.

Another variation on the basic concept of the capacitor chip disclosed herein is shown in side sectional view in FIG. 6, wherein the bands 11 and 12 are provided with respective tongues 31 and 32. As shown in FIG. 7, the tongue 32 extends between two spaced interior portions 14 of the band 12. FIG. 7 is shown before encapsulation of the capacitor member 1 and the interior portions of the band 12. This construction particularly provides improved mechanical support for the component during the manufacturing process.

Another embodiment of a capacitor chip constructed in accordance with the principles of the present invention is shown in FIG. 8 in side sectional view, wherein the bands 11 and 12 are provided with respective interior bends 33 and 34 which enlarge the lower soldering surfaces 16 and 17 without enlarging the overall size of the capacitor chip. The bends 33 and 34 are generally U-shaped. Such enlarged soldering surfaces may be necessary when the width of the envelope 15 is small so that the necessary soldering surface of at least one millimeter in width would otherwise not be met.

Another method for attaching the interior end 14 of the band 12 to the metal plating 8 of the capacitor member 1 is shown in FIG. 9, before encapsulation. In this embodiment, the interior end 14 is provided with a plurality of spaced pressure contacts 24, and is slightly angled so as to push against the plating 8 by spring pressure. No other additional contact means is utilized, the necessary support and rigidity being achieved by the encapsulation envelope 15 when it is applied. A portion of the margin 27 of a continuous strip or plate which is utilized in the manufacture of these components, described in detail below, can be seen in FIG. 9.

Another lead attachment embodiment is shown in FIG. 10 wherein the interior portion 14 of the band 12 is to an extent thermally isolated from the remainder of the band 12 by a narrowed neck portion 25. By utilizing the narrowed neck 25 it is insured that heat supplied to attach the interior portion 14 to the plating 8, such as by soldering or welding, will uniformly radiate throughout the entire interior portion 14, thereby avoiding heat concentration at one or more discrete points. Additionally, the neck 25 insures that during soldering of the capacitor chip to a printed circuit board, the amount of heat supplied at the connection location which reaches the interior portion 14 is considerably reduced. Additionally, the neck 25 provides a certain spring action which is useful in the manufacturing method described below.

A variation on the embodiment shown in FIG. 10 is shown in FIG. 11, wherein two spaced necks 25 are provided, and the interior portion 14 is accordingly split into spaced segments.

Another embodiment of a capacitor chip constructed in accordance with the principles of the present invention is shown in FIG. 12, wherein the interior portions 13 and 14 of the bands 11 and 12 are each provided with an angled flange 26 such that the exterior portion of the bands emerges laterally. The angled flanges 26 compensate for slight variations in dimensions which may occur in the manufacture of the capacitor member 1. A perspective view of one of the bands 12 by itself is shown in FIG. 13.

Two further embodiments for attaching the interior portions 13 and 14 of the bands 11 and 12 to the respective platings 7 and 8 are shown in FIG. 14. It will be understood that these embodiments would not occur simultaneously in a single chip, these alternative embodiments being shown in the single figure for purpose of convenience. The structure at the left of FIG. 14 shows the interior portion 14 of the band 12 downwardly angled so as to come into contact with an edge of the plating 8, thereby improving connection by welding. In the connection shown at the right of FIG. 14, the interior portion 13 of the band 11 contacts the plating 7 at a smaller surface thereof. The larger vertically extending surfaces of the platings 7 and 8 may be considered the major faces of those plates, and the smaller horizontally extending surfaces may be considered the minor faces of those platings. Utilizing this nomenclature, the interior portion 13 of the band 11 is connected to a minor face of the plating 7.

The various steps of a manufacturing method for assembling capacitors of the type described above is shown in FIG. 15. A strip or plate of tinned flexible metal of the type utilized in the production of various types of circuit components is provided. The strip may, for example, have a coating on both sides of tin-lead solder of approximately 4 through 8 micrometers in thickness. The strip is provided with a plurality of recesses 28, such as by cutting or stamping, which leave a plurality of generally parallel transverse bands continuously extending between parallel margins 27. Each band is cut generally at the center thereof, so as to form bands 11 and 12, still connected to the margins 27. The cut free ends of the bands 11 and 12 are bent upwardly forming the portions 13 and 14 which will become the interior portions of the current leads. As shown in FIG. 15, these portions 13 and 14 may be provided on both sides with an adhesion promoting layer 38.

Figure 16:
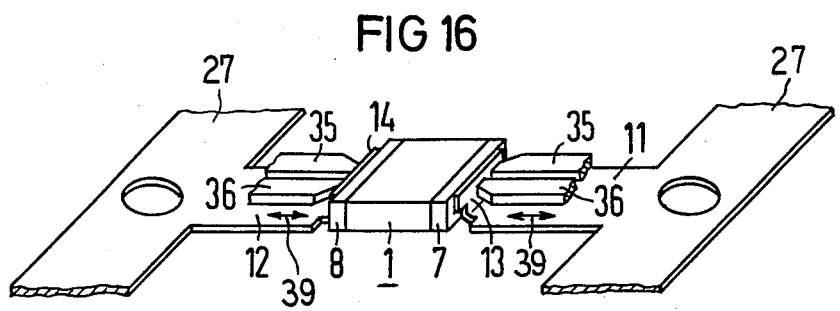
FIG. 16 is a perspective view showing one method of attaching a portion of the bands forming the current leads to the metal plates of the capacitor which can be utilized in the method shown in FIG. 15.

A capacitor member 1 having metal platings 7 and 8 at opposite end faces is inserted from below in the direction of arrow 37 between the free ends 13 and 14. The platings 7 and 8 are then attached to the portions 13 and 14 by any suitable method, such as by spot welding by means of electrodes 35 and 36 which are laterally movable toward and away from the portions 13 and 14, as indicated by the double arrows in FIG. 16. Other types of attachment methods such as ultrasonic welding, percussion welding, as well as diverse soldering methods such as flow soldering, high frequency induction soldering, or laser soldering may be utilized. The interior length L2 shown in FIG. 15 is conditioned by manufacturing tolerances and may fluctuate from capacitor member to capacitor member. The various compensating structures described above may be utilized to insure that the completed length L (FIG. 2) will be as uniform as possible.

In the next step, an envelope 15 of encapsulating plastic of the type described above is generated around the capacitor component 1 and the band portions 13 and 14. The thickness d of the envelope 15 is at least 0.1 millimeters, and has narrowly controlled dimensions as explained in connection with FIG. 2. Encapsulation methods suitable for achieving such an envelope are known in the art such as pressing, spraying or sintering.

In the next method step, the exposed portions 29 and 30 of the bands are severed from the margins 27 and are bent into one of the various configurations described above. By strictly controlling the length L of the encapsulation, the overall length L1, including the exterior portions of the current leads, can be equally strictly controlled.

For improved moisture resistance of the completed capacitor chip, the capacitor member 1 may be impregnated with hot wax after the metal platings 7 and 8 are applied, or those platings may be provided with an insulating layer. The adhesion promoting layer 38 may be applied at least to those surfaces of the bands which come into contact with the platings 7 and 8 and the encapsulation envelope 15.

Although modifications and changes may be suggested by those skilled in the art it is the intention of the inventors to embody within the patent warranted hereon all changes and modificatons as reasonably and properly come within the scope of their contribution to the art.

We claim as our invention:

1. A capacitor chip adapted for attachment to a printed circuit board by soldering using solder flux and a subsequent cleaning agent comprising:
    a capacitor member having at least one metal layer electrically connected to a metal plating at one end face of said capacitor member and at least one other metal layer electrically connected to a metal plating at an opposite end face of said capacitor member, said metal layers having plastic dielectric material therebetween;
    two metal bands having interior portions respectively electrically connected to said platings forming current leads for said capacitor chip;
    an encapsulation envelope consisting of high temperature resistant plastic impervious to molten solder, said solder flux and said cleaning agent surrounding said capacitor member and said interior portions of said bands;
    said bands each having respective exterior portions bent around and conforming to a portion of the exterior surface of said encapsulation envelope and forming a plurality of soldering surfaces for said capacitor chip, and each band having a narrowed neck disposed between said interior and exterior portions for substantially thermally isolating said interior portion and said capacitor member from heat generated during soldering of said exterior portion; and
    adhesion promotor disposed between each of said metal layer and said metal plating and those portions of said metal band and said encapsulation envelope in contact therewith.

2. A capacitor chip as claimed in claim 1 wherein said interior portions of said two bands are connected to said platings by soldering.

3. A capacitor chip as claimed in claim 1 wherein said interior portions of said two bands are connected to said platings by welding.

4. A capacitor chip as claimed in claim 1 wherein said interior portions of said two bands are connected to said platings by a conductive adhesive.

5. A capacitor chip as claimed in claim 1 wherein said interior portions of said two bands are connected to said platings by spring pressure and are held in place thereagainst by said encapsulation envelope.

6. A capacitor chip as claimed in claim 1 wherein said narrowed neck portion is split into two segments, and wherein said interior portions of each band are split into two segments respectively connected to said split portions of said neck portion.

7. A capacitor chip as claimed in claim 1 wherein the interior portion of each of said bands has an angled bend therein for compensating for dimensional variations in said capacitor member.

8. A capacitor chip as claimed in claim 1 wherein said capacitor chip has a bottom, a top, and spaced end faces, and wherein said exterior portions of said bands respectively emerge from said encapsulation envelope at said bottom face, extend upwardly over said end faces, and extend partially over and terminate on said top face, thereby forming spaced bottom soldering surfaces and spaced top soldering surfaces for said capacitor chip.

9. A capacitor chip as claimed in claim 8 wherein said capacitor chip further has spaced front and rear faces, and wherein each of said exterior portions of said bands has a pair of flaps extending partially over and terminating on said front and rear faces, thereby providing spaced front soldering surfaces and spaced rear soldering surfaces.

10. A capacitor chip as claimed in claim 9 wherein said interior portions of each of said bands have a U-shaped bend extending inwardly within said encapsulation envelope partially beneath said capacitor member for enlarging said bottom soldering surfaces.

11. A capacitor chip as claimed in claim 1 wherein said capacitor chip has spaced end faces and a top face, and wherein said exterior portions of said bands respectively emerge from said end faces and extend over said end faces and partially extend over and terminate on said top surface, thereby forming spaced top soldering surfaces.

12. A capacitor chip as claimed in claim 1 wherein said interior portion of each of said bands is divided into a tongue portion extending beneath said plating and two spaced upright portions on opposite sides of said tongue portion.

13. A capacitor chip as claimed in claim 1 wherein each of said platings has a major surface, and wherein said interior portions of said bands are respectively connected to said major surfaces of said platings.

14. A capacitor chip as claimed in claim 1 wherein each of said platings has a minor surface, and wherein said interior portions of said bands are respectively connected to said minor surfaces.

15. A capacitor chip as claimed in claim 1 wherein each of said platings has an edge, and wherein said interior portions of said bands are respectively connected to said edges of said platings.

* * * * *